(12) United States Patent
Ishii et al.

(10) Patent No.: US 7,694,416 B2
(45) Date of Patent: Apr. 13, 2010

(54) PRODUCING METHOD OF WIRED CIRCUIT BOARD

(75) Inventors: Jun Ishii, Osaka (JP); Yasunari Ooyabu, Osaka (JP); Hiroyuki Kurai, Osaka (JP)

(73) Assignee: Nitto Denko Corporation, Osaka (JP)

( * ) Notice: Subject to any disclaimer, the term of this patent is extended or adjusted under 35 U.S.C. 154(b) by 152 days.

(21) Appl. No.: 11/987,976

(22) Filed: Dec. 6, 2007

(65) Prior Publication Data

US 2008/0134500 A1 Jun. 12, 2008

Related U.S. Application Data

(60) Provisional application No. 60/907,021, filed on Mar. 16, 2007.

(30) Foreign Application Priority Data

Dec. 8, 2006 (JP) ............................. 2006-332188

(51) Int. Cl.
*H05K 3/02* (2006.01)
(52) U.S. Cl. ............................. 29/846; 29/825; 29/831; 29/847; 174/255; 174/257
(58) Field of Classification Search ............... 29/825, 29/831, 846, 847; 174/255, 257
See application file for complete search history.

(56) References Cited

U.S. PATENT DOCUMENTS

| | | | |
|---|---|---|---|
| 6,171,468 B1 * | 1/2001 | Thorn et al. ................ | 205/118 |
| RE37,765 E * | 6/2002 | Randolph et al. ........... | 428/408 |
| 6,710,259 B2 * | 3/2004 | Thorn et al. ................ | 174/257 |
| 7,433,200 B2 * | 10/2008 | Ishii et al. .................. | 361/760 |
| 2003/0108664 A1 * | 6/2003 | Kodas et al. ................ | 427/125 |
| 2003/0151902 A1 | 8/2003 | Kageyama et al. | |
| 2007/0246247 A1 * | 10/2007 | Ooyabu et al. .............. | 174/255 |
| 2008/0000873 A1 * | 1/2008 | Mazzara et al. ............. | 216/13 |
| 2008/0029293 A1 * | 2/2008 | Ooyabu et al. .............. | 174/250 |
| 2008/0134500 A1 * | 6/2008 | Ishii et al. .................. | 29/831 |

FOREIGN PATENT DOCUMENTS

JP 2004-158480 6/2004

* cited by examiner

*Primary Examiner*—C. J Arbes
(74) *Attorney, Agent, or Firm*—Jean C. Edwards, Esq.; Akerman Senterfitt (57) ABSTRACT

A producing method of a wired circuit board includes the steps of preparing a wired circuit board having an insulating layer and a conductive pattern including a wire covered with the insulating layer and a terminal portion exposed from the insulating layer, disposing a contact member formed of a material having a standard electrode potential lower than that of a conductive material forming the conductive pattern such that the contact member is in contact with the conductive pattern and exposed from the insulating layer, and dipping the wired circuit board including the disposed contact member in a polymerization solution of a conductive polymer to form a semiconductive layer on the surface of the insulating layer.

6 Claims, 8 Drawing Sheets

PRODUCING METHOD OF WIRED CIRCUIT BOARD

CROSS REFERENCE TO RELATED APPLICATION

This application claims the benefit of U.S. Provisional Application No. 60/907,021, filed Mar. 16, 2007, and claims priority from Japanese Patent Application No. 2006-332188, filed Dec. 8, 2006, the contents of which are herein incorporated by reference in their entirety.

BACKGROUND OF THE INVENTION

1. Field of the Invention

The present invention relates to a producing method of a wired circuit board and, more particularly, to a producing method of a wired circuit board such as a suspension board with circuit.

2. Description of the Related Art

There has been conventionally known a wired circuit board in which an insulating base layer, a conductive pattern having wires and terminal portions, and an insulating cover layer are successively laminated. Such a wired circuit board is widely used in the field of various electric and electronic equipment.

As a producing method of such a wired circuit board, a producing method of a flexible printed circuit board has been proposed in which, with a view to preventing electrostatic breakdown of an electronic component mounted thereon, a laminate (board main body) composed of, e.g., a base layer, conductor circuits, and cover layers is produced, and then conductive polymer layers are formed around the laminate (see, e.g., Japanese Unexamined Patent No. 2004-158480).

SUMMARY OF THE INVENTION

However, in the producing method of a flexible printed circuit board described in Japanese Unexamined Patent No. 2004-158480, the laminate is dipped in an oxidative treatment solution containing a monomer and an oxidative polymerization agent in the formation of the conductive polymer layers. As a result, there may be a case where a conductive material forming the conductor circuits is dissolved by such a treatment solution at the terminal portions of the conductor circuits exposed from the cover layers. This may result in corrosion and discoloration of the terminal portions.

It is therefore an object of the present invention to provide a producing method of a wired circuit board which allows the prevention of discoloration of a terminal portion, and also allows efficient removal of static electricity from the obtained wired circuit board.

A producing method of a wired circuit board according to the present invention comprises the steps of preparing a wired circuit board comprising an insulating layer and a conductive pattern including a wire covered with the insulating layer and a terminal portion exposed from the insulating layer, disposing a contact member formed of a material having a standard electrode potential lower than that of a conductive material forming the conductive pattern such that the contact member is in contact with the conductive pattern and exposed from the insulating layer, and dipping the wired circuit board including the disposed contact member in a polymerization solution of a conductive polymer to form a semiconductive layer on a surface of the insulating layer.

In the producing method of the wired circuit board, the contact member formed of the material having the standard electrode potential lower than that of the conductive material forming the conductive pattern is disposed to be in contact with the conductive pattern and exposed from the insulating layer. As a result, when the wired circuit board including the disposed contact member is dipped in the polymerization solution of the conductive polymer, the contact member is in contact with the conductive pattern. In addition, because the standard electrode potential of the material forming the contact member is lower than that of the conductive material forming the conductive pattern, a local cell is formed in the contact member and the conductive pattern. Therefore, due to the principle of such a local cell, the material forming the contact member having the standard electrode potential lower than that of the conductive material forming the conductive pattern (i.e., having a higher ionization tendency) is dissolved, while the conductive material forming the conductive pattern is less likely to be dissolved, even though the conductive material is exposed at the terminal portion.

As a result, it is possible to prevent corrosion of the terminal portion, and also form the semiconductive layer on the surface of the insulating layer.

This allows the prevention of discoloration of the terminal portion, and also allows efficient removal of static electricity from the obtained wired circuit board.

In the producing method of the wired circuit board according to the present invention, it is preferable that the step of preparing the wired circuit board includes forming a plating layer on a surface of the terminal portion.

In general, in a producing method of a wired circuit board, there is a case where a plating layer is formed on the surface of a terminal portion to protect the terminal portion. However, when the wired circuit board is dipped in a polymerization solution of a conductive polymer, the polymerization solution of the conductive polymer may penetrate through the interface between the peripheral end of the plating layer and an insulating layer. Accordingly, a conductive material at the terminal portion may be dissolved to corrode the terminal portion.

However, in this producing method of the wired circuit board, the conductive material of the terminal portions is less likely to be dissolved due to the principle of the local cell described above. As a result, even when the plating layer is formed on the surface of the terminal portion and the polymerization solution of the conductive polymer penetrates through the interface between the peripheral end of the plating layer and the insulating layer, while result in less concern of such corrosion. This allows effective prevention of discoloration of the terminal portion.

In the producing method of the wired circuit board according to the present invention, it is preferable that the step of preparing the wired circuit board includes forming an exposed portion in the conductive pattern, the exposed portion being exposed from the insulating layer for the disposition of the contact member.

In the producing method of the wired circuit board, the exposed portion exposed from the insulating layer is formed in the conductive pattern for the disposition of the contact member. Therefore, by disposing the contact member on the exposed portion, the contact member can be easily disposed.

In the producing method of the wired circuit board according to the present invention, it is preferable that the contact member is a protective layer laminated on the exposed portion.

In the producing method of the wired circuit board, the contact member is the protective layer laminated on the exposed portion. As a result, the protective layer can be reliably brought into contact with the conductive pattern. This allows reliable prevention of corrosion of the terminal portion, and consequently allows reliable prevention of discoloration of the terminal portion.

In the producing method of the wired circuit board according to the present invention, it is preferable that the step of disposing the contact member includes disposing the contact member removably on the exposed portion and dipping the wired circuit board with the disposed contact member in the polymerization solution of the conductive polymer and then removing the contact member from the exposed portion.

In the producing method of the wired circuit board, the contact member is removably disposed on the exposed portion and, after the semiconductive layer is formed, the contact member is removed. This prevents the contact member from remaining on the wired circuit board and allows an improvement in the reliability of the wired circuit board.

In the producing method of the wired circuit board according to the present invention, it is preferable that the conductive material of the conductive pattern is copper, and the material of the contact member is lead and/or tin.

Because lead and/or tin is lower in standard electrode potential than copper, the dissolution of copper in the terminal portion is reliably suppressed.

This allows reliable prevention of corrosion of the terminal portion, and consequently allows reliable prevention of discoloration of the terminal portion.

In the producing method of the wired circuit board according to the present invention, it is preferable that the semiconductive polymer is polyaniline.

In the producing method of the wired circuit board, the conductive polymer is polyaniline. Accordingly, the obtained wired circuit board allows more efficient removal of static electricity from the obtained wired circuit board.

DETAILED DESCRIPTION OF THE INVENTION

Figure 1:
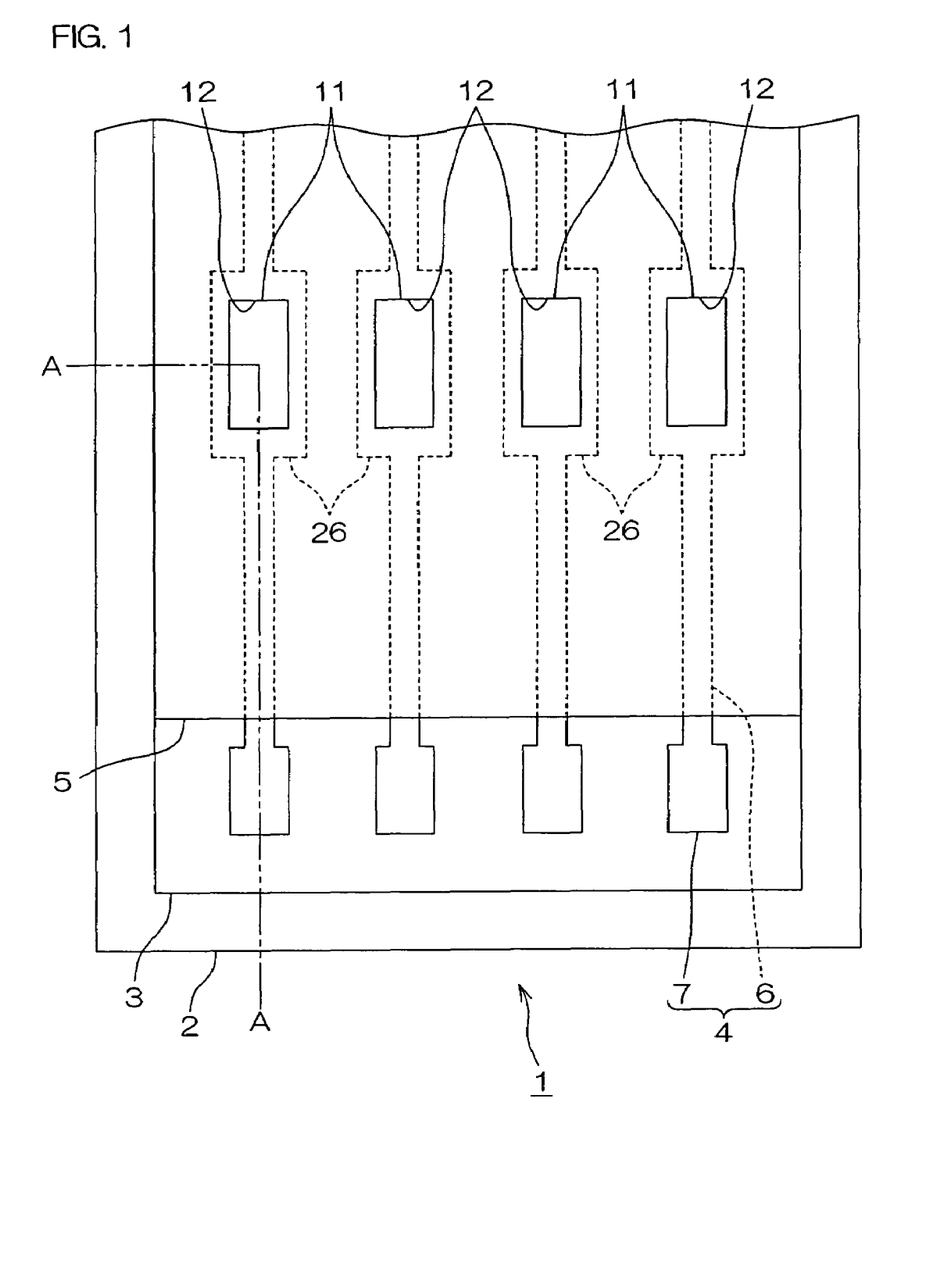
FIG. 1 is a partial plan view of a suspension board with circuit as an embodiment of a wired circuit board produced by a producing method of a wired circuit board according to the present invention.
Figure 2:
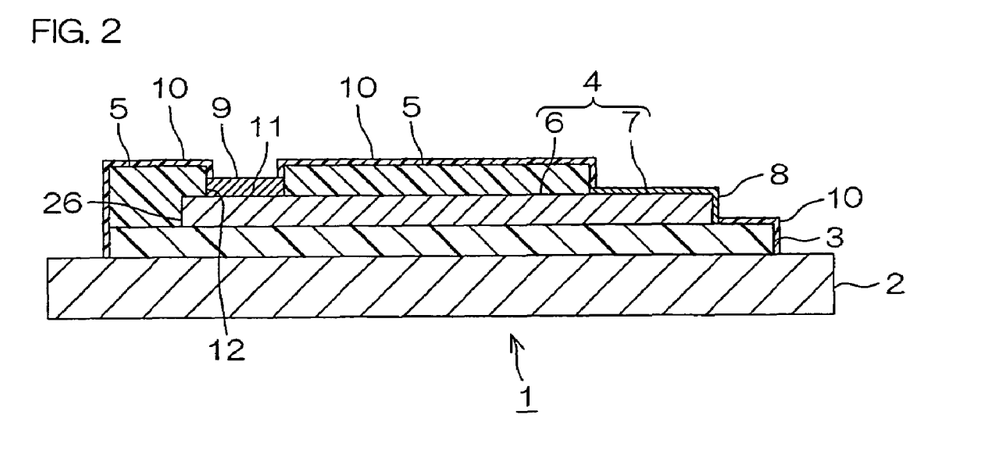
FIG. 2 is a cross-sectional view along the line A-A of the suspension board with circuit shown in FIG. 1.

FIG. 1 is a partial plan view of a suspension board with circuit as an embodiment of a wired circuit board produced by a producing method of a wired circuit board according to the present invention. FIG. 2 is a cross-sectional view along the line A-A of the suspension board with circuit shown in FIG. 1.

In FIG. 1, a suspension board with circuit 1 has a metal supporting board 2 carried on a hard disk drive to mount a magnetic head (not shown) thereon, while holding a minute gap between the magnetic head and a magnetic disk against an air flow caused when the magnetic head and the magnetic disk travel relatively to each other. The suspension board with circuit 1 also has a conductive pattern 4 formed on the metal supporting board 2 to connect the magnetic head to a read/write board (not shown).

In FIG. 1, a plating layer 8, protective layers 9, and a semiconductive layer 10, which are described later, are omitted for clear illustration of the placement of the conductive pattern 4.

The conductive pattern 4 integrally and continuously includes magnetic-head-side connection terminal portions 7, external connection terminal portions not shown, and wires 6 for connecting the magnetic-head-side connection terminal portions 7 and the external connection terminal portions not shown.

The plurality of (four) wires 6 are provided along the longitudinal direction of the suspension board with circuit 1 (hereinafter simply referred to as the longitudinal direction) and arranged in mutually spaced-apart and parallel relation in a widthwise direction (perpendicular direction to the longitudinal direction; hereinafter referred to as such).

The conductive pattern 4 also includes protruding portions 26. The protruding portions 26 are formed in the longitudinal middle portions of the respective wires 6 at positions corresponding to the openings 12 of an insulating cover layer 5, described later, to protrude in both widthwise directions. Each of the protruding portions 26 is formed to have a generally rectangular shape when viewed in plan view.

The magnetic-head-side connection terminal portions 7 are arranged in parallel at the front end portion of the metal supporting board 2 to be spaced apart from each other along the widthwise direction. Each of the magnetic-head-side connection terminal portions 7 is formed as a quadrilateral land extending in the longitudinal direction and having a generally rectangular shape when viewed in plan view. The plurality of (four) magnetic-head-side connection terminals portions 7 are provided to be connected to the respective front end portions of the wires 6.

The external connection terminal portions not shown are arranged in parallel at the rear end portion of the metal supporting board 2 to be spaced apart from each other along the widthwise direction. Each of the external connection terminal portions is formed as a quadrilateral land extending in the longitudinal direction and having a generally rectangular shape when viewed in plan view. The plurality of (four) external connection terminal portions are provided to be connected to the respective rear end portions of the wires 6. To the external connection terminal portions, terminal portions (not shown) of the read/write board (not shown) are connected.

The magnetic-head-side connection terminal portions 7 and the external connection terminal portions are hereinafter simply described as a terminal portion 7 when distinction therebetween is not particularly needed.

As shown in FIG. 2, the suspension board with circuit 1 includes the metal supporting board 2, an insulating base layer 3 formed on the metal supporting board 2, the conductive pattern 4 formed on the insulating base layer 3, and the insulating cover layer 5 formed on the insulating base layer 3 to cover the conductive pattern 4. The suspension board with circuit 1 also includes the plating layer 8 formed on the surface of the terminal portion 7 of the conductive pattern 4, the protective layer 9 as a contact member formed on an exposed portion 11 of the conductive pattern 4 described later, and the semiconductive layer 10 formed on the surface of the insulating cover layer 5 and on the surface of the insulating base layer 3.

As shown in FIG. 1, the metal supporting board 2 is formed in the shape of a generally rectangular sheet extending along the longitudinal direction when viewed in plan view. The metal supporting board 2 is formed of a metal material such as stainless steel, 42-alloy, aluminum, copper-beryllium alloy, or phosphor bronze. The thickness of the metal supporting board 2 is in the range of, e.g., 15 to 30 µm, or preferably 20 to 25 µm.

As shown in FIGS. 1 and 2, the insulating base layer 3 is formed in the shape of a generally rectangular sheet which is slightly shorter than the metal supporting board 2 in the longitudinal direction and the widthwise direction on the metal supporting board 2. The insulating base layer 3 is formed of an insulating material such as a synthetic resin including e.g., polyimide, polyamide imide, acryl, polyether nitrile, polyether sulfone, polyethylene terephthalate, polyethylene naphthalate, or polyvinyl chloride. Preferably, the insulating base layer 3 is formed of polyimide. The thickness of the insulating base layer 3 is in the range of, e.g., 1 to 35 µm, or preferably 8 to 15 µm. The length (longitudinal length; hereinafter referred to as such) of the insulating base layer 3 and the width (widthwise length; hereinafter referred to as such) thereof are appropriately set in correspondence to the metal supporting board 2.

The conductive pattern 4 is formed on the insulating base layer 3 as a wired circuit pattern which is formed integrally from the wires 6 and from the terminal portions 7 connected to the wires 6.

The wires 6 are formed to be covered with the insulating cover layer 5.

The terminal portions 7 are formed on both the longitudinal end portions of the insulating base layer 3 to be exposed from both the end portions of the insulating cover layer 5.

In the conductive pattern 4, the exposed portions 11 exposed from openings 12 of the insulating cover layer 5 described later are formed inside the protruding portions 26 located in the longitudinal middle portions of the wires 6. The exposed portions 11 are provided as the portions of the conductive pattern 4 exposed from the insulating cover layer 5 for the formation of the protective layers 9.

The conductive pattern 4 is formed of a conductive material having a standard electrode potential (at 25° C.) in the range of, e.g., 0 to 2.0 V, or preferably 0.1 to 0.5 V. More specifically, the conductive pattern 4 is made of a conductive material such as copper (standard electrode potential of 0.337 V at 25° C.), gold (standard electrode potential of 1.50 V at 25° C.), or an alloy thereof. Preferably, the conductive pattern 4 is made of copper. The standard electrode potential is a relative potential to a hydrogen electrode (NHE).

The thickness of the conductive pattern 4 is in the range of, e.g., 3 to 50 µm, or preferably 5 to 20 µm. The width of each of the wires 6 is in the range of, e.g., 10 to 200 µm, or preferably 20 to 100 µm. The spacing between the individual wires 6 is in the range of, e.g., 10 to 30000 µm, or preferably 20 to 100 µm. The length of each of the terminal portions 7 is in the range of, e.g., 50 to 2000 µm, or preferably 100 to 1000 µm, and the width thereof is in the range of, e.g., 50 to 2000 µm, or preferably 100 to 1000 µm. The width of the protruding portions 26 is in the range of, e.g., 0.2 to 12 mm, or preferably 1.0 to 7 mm. The length of the protruding portion 26 is appropriately set in accordance with the length of each of the openings 12.

The insulating cover layer 5 is formed in the shape of a generally rectangular sheet extending along the longitudinal direction when viewed in plan view. More specifically, in the widthwise direction, the insulating cover layer 5 has both widthwise end edges thereof placed at the same positions as both the widthwise end edges of the insulating base layer 3 when viewed in plan view. Furthermore, in the longitudinal direction, the insulating cover layer 5 is arranged in a manner such that both the longitudinal end edges thereof is shorter than both the longitudinal end edges of the insulating base layer 3. As a result, the insulating cover layer 5 covers the wires 6 of the conductive pattern 4 and exposes the terminal portions 7 of the conductive pattern 4. The insulating cover layer 5 is formed of the same insulating material as that of the insulating base layer 3 mentioned above.

The insulating cover layer 5 has the openings 12 formed to penetrate the insulating cover layer 5 in the thickness direction thereof.

The plurality of (four) openings 12 are formed to be placed opposite to the wires 6 in the thickness direction. The individual openings 12 are provided to correspond to the respective wires 6. Each of the openings 12 is opened to have a generally rectangular shape extending in the longitudinal direction and slightly smaller than the protruding portion 26 of the conductive pattern 4 when viewed in plan view.

The thickness of the insulating cover layer 5 is in the range of, e.g., 1 to 40 µm, or preferably 1 to 7 µm. The length of the insulating cover layer 5 is appropriately set in accordance with the size of the insulating base layer 3 and the terminal portions 7. The length of each of the openings 12 is in the range of, e.g., 0.1 to 10 mm, or preferably 0.5 to 5 mm. The width thereof 12 is in the range of, e.g., 0.1 to 10 mm, or preferably 0.5 to 5 mm.

The plating layer 8 is formed on the upper surface, both longitudinal side surfaces (except for the portions connected to both the end portions of the corresponding wire 6), and both widthwise side surfaces (not shown in FIG. 2) of the terminal portion 7. As a material for the plating layer 8, a metal material such as, e.g., gold is used. The thickness of the plating layer 8 is in the range of, e.g., 0.2 to 3 μm, or preferably 0.5 to 2 μm.

The protective layers 9 are provided on the respective exposed portions 11 of the conductive pattern 4 to fill in the respective openings 12 of the insulating cover layer 5. That is, the protective layers 9 are laminated on the exposed portions 11 to be in contact with the conductive pattern 4 and exposed from the openings 12 of the insulating cover layer 5.

The protective layers 9 are formed of a material having a standard electrode potential lower than that of the conductive material forming the conductive pattern 4.

The standard electrode potential (at 25° C.) of the material forming the protective layers 9 is set to be lower than the standard electrode potential (at 25° C.) of the conductive material forming the conductive pattern 4 by, e.g., 0.05 to 2.0 V, or preferably 0.2 to 2.0 V. More specifically, the standard electrode potential (at 25° C.) of the material forming the protective layers 9 is in the range of, e.g., −2.0 to 0 V, or preferably −1.8 to −0.1 V.

Examples of the material used to form the protective layers 9 include lead (having a standard electrode potential of −0.126 V at 25° C.), tin (having a standard electrode potential of −0.136 V at 25° C.), nickel (having a standard electrode potential of −0.250 V at 25° C.), iron (having a standard electrode potential of −0.44 V at 25° C.), zinc (having a standard electrode potential of −0.763 V at 25° C.), aluminum (having a standard electrode potential of −1.66 V at 25° C.), and an alloy (including an eutectic alloy) thereof. Preferably, lead, tin, nickel, an alloy thereof, or the like is used, or more preferably, lead, tin, or an alloy thereof is used.

The thickness of the protective layers 9 is in the range of, e.g., 0.1 to 500 μm, or preferably 1 to 200 μm.

The semiconductive layer 10 is formed on the upper surface, both longitudinal side surfaces, and both widthwise side surfaces (including the inner side surfaces of the openings 12) of the insulating cover layer 5, on the upper surface of the insulating base layer 3 exposed from the insulating cover layer 5 and the conductive pattern 4, and on both the longitudinal side surfaces and both widthwise side surfaces of the insulating base layer 3.

The semiconductive layer 10 is formed of a conductive polymer produced by dipping in a polymerization solution of the conductive polymer described later.

Examples of the conductive polymer include e.g., polyaniline, polypyrrole, polythiophene, or a derivative thereof. Preferably, polyaniline is listed. These conductive polymers can be used alone or in a combination of two or more kinds.

The thickness of the semiconductive layer 10 is in the range of, e.g., 0.01 to 0.1 μm, or preferably 0.02 to 0.05 μm.

Next, a description will be given to a producing method of the suspension board with circuit 1 with reference to FIGS. 3 and 4.

Figure 3:
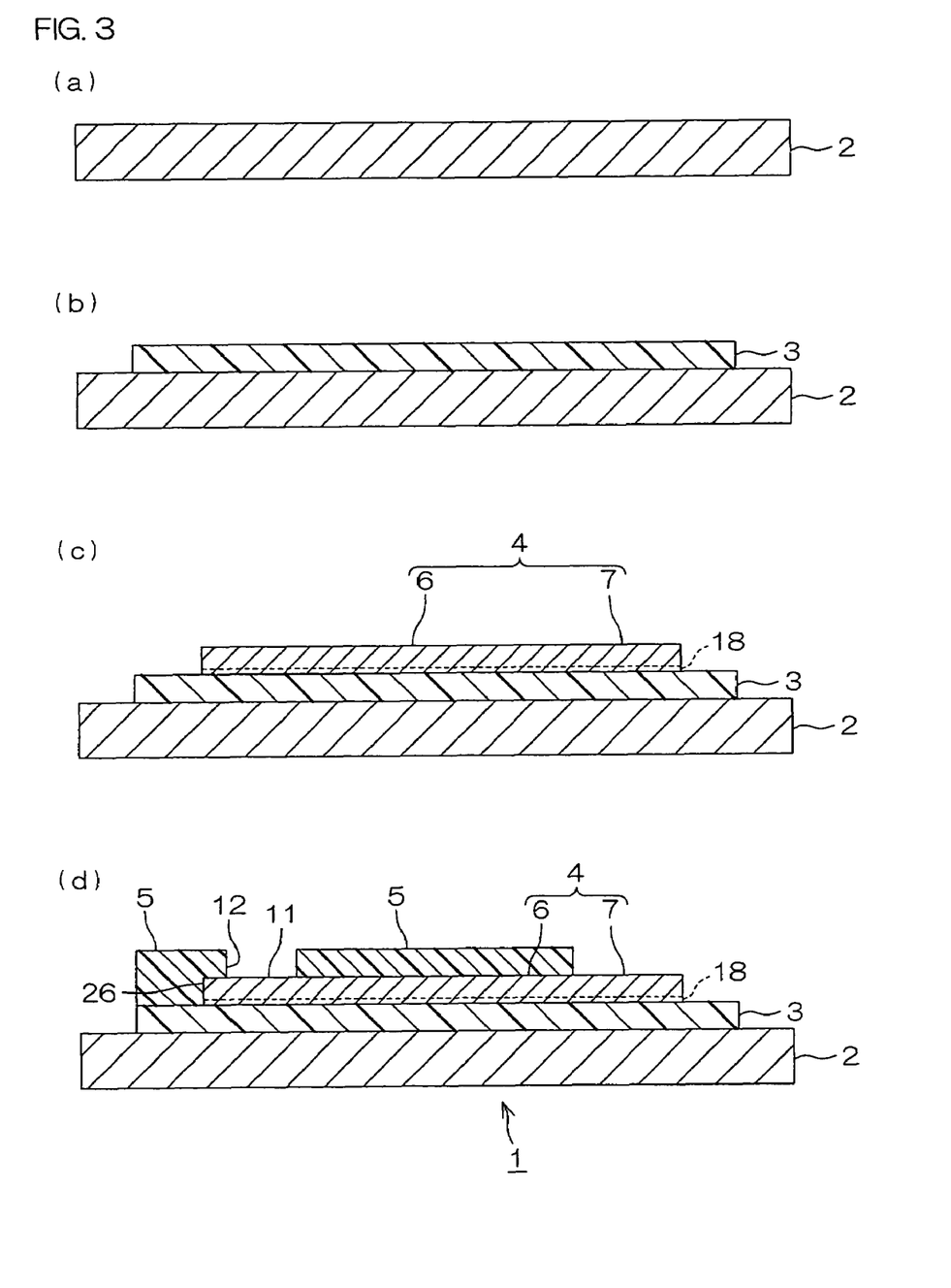
FIG. 3 is a cross-sectional view showing the process steps of producing the suspension board with circuit shown in FIG. 2, (a) showing the step of preparing a metal supporting board, (b) showing the step of forming an insulating base layer on the metal supporting board, (c) showing the step of forming a conductive pattern on the insulating base layer, and (d) showing the step of forming an insulating cover layer in a pattern having an opening on the insulating base layer.

First, as shown in FIG. 3(a), the metal supporting board 2 is prepared in the method.

Next, as shown in FIG. 3(b), the insulating base layer 3 is formed in the foregoing pattern on the metal supporting board 2.

To form the insulating base layer 3 in the foregoing pattern, e.g., a varnish of a photosensitive insulating material as mentioned above is coated on the upper surface of the metal supporting board 2, dried, exposed to light via a photomask, developed, and then cured as necessary.

Next, as shown in FIG. 3(c), the conductive pattern 4 is formed in the foregoing wired circuit pattern on the insulating base layer 3.

The conductive pattern 4 is formed by a known patterning method such as, e.g., an additive method or a subtractive method. Preferably, the conductive pattern 4 is formed by the additive method.

In the additive method, a metal thin film 18 indicated by the imaginary line is formed first on the upper surface, both longitudinal side surfaces, and both widthwise side surfaces of the insulating base layer 3 and on the upper surface of the metal supporting board 2 exposed from the insulating base layer 3. The metal thin film 18 is formed by sputtering, or preferably successively laminating a chromium thin film and a copper thin film by chromium sputtering and copper sputtering.

Next, a plating resist, not shown, is formed in a pattern reverse to the foregoing pattern on the upper surface of the metal thin film 18. Then, the conductive pattern 4 is formed in the foregoing pattern on the upper surface of the metal thin film 18 exposed from the plating resist by electrolytic plating. Thereafter, the plating resist and the portion of the metal thin film 18 where the plating resist is laminated are removed.

In this manner, the conductive pattern 4 can be formed in the foregoing wired circuit pattern on the insulating base layer 3.

Next, as shown in FIG. 3(d), the insulating cover layer 5 is formed on the insulating base layer 3 to have a pattern covering the wire 6 of the conductive pattern 4, exposing the terminal portion 7 of the conductive pattern 4, and having the opening 12.

To form the insulating cover layer 5 in the foregoing pattern, e.g., a varnish of a photosensitive insulating material as mentioned above is coated on the upper surface of the metal supporting board 2 including the conductive pattern 4 and the insulating base layer 3, dried, exposed to light via a photomask, developed, and then cured as necessary.

Figure 4:
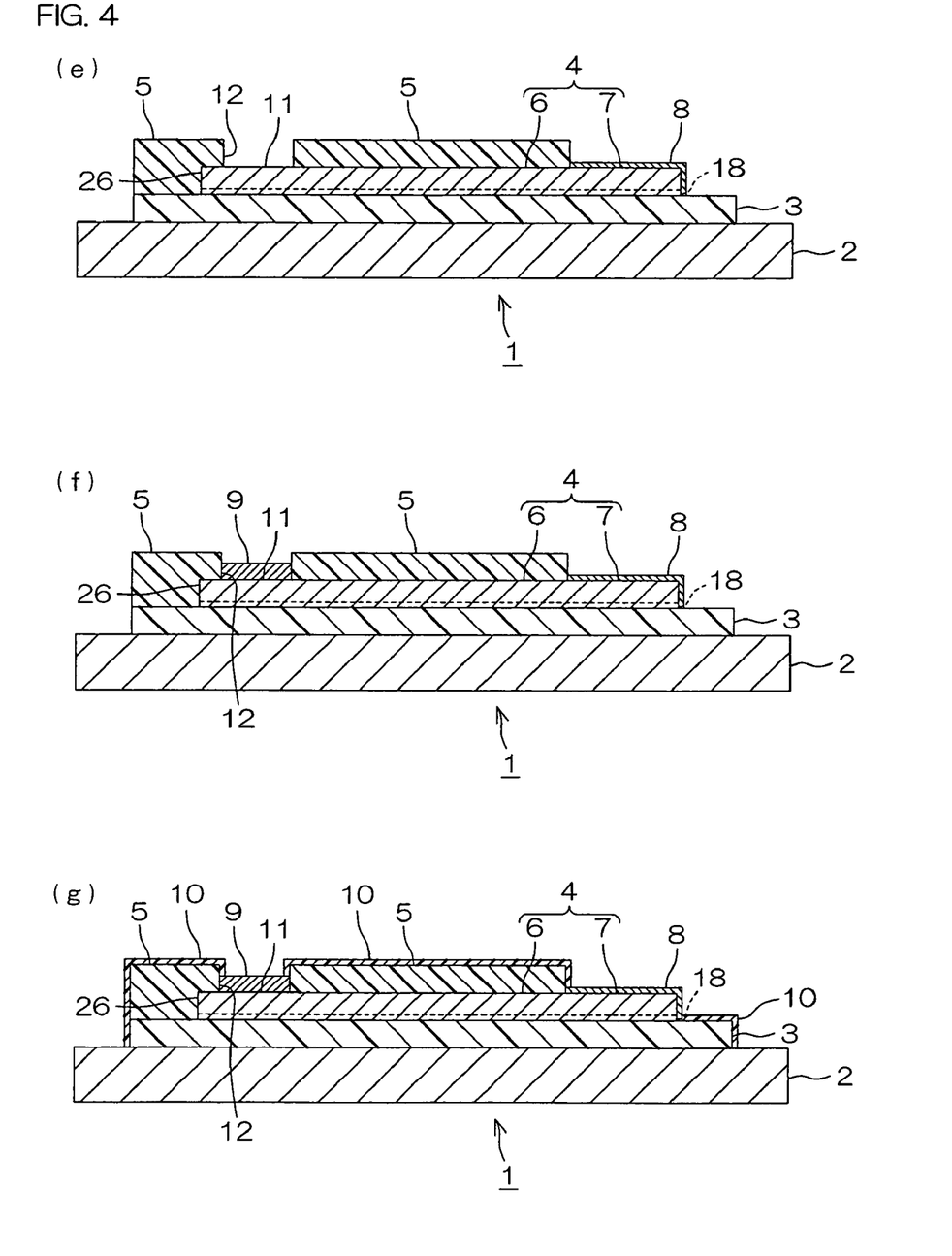
FIG. 4 is a cross-sectional view showing the process steps of producing the suspension board with circuit shown in FIG. 2, subsequently to FIG. 3, (e) showing the step of forming a plating layer on the surface of a terminal portion, (f) showing the step of forming a protective layer on an exposed portion, and (g) showing the step of forming a semiconductive layer on the surface of the insulating cover layer and on the surface of the insulating base layer.

Next, as shown in FIG. 4(e), the plating layer 8 is formed on the terminal portions 7.

To form the plating layer 8, e.g., a plating resist not shown is formed to cover the metal supporting board 2 and the exposed portions 11 and then, e.g., electrolytic plating or electroless plating is performed. Preferably, electrolytic gold plating or electroless gold plating is performed. Thereafter, the plating resist is removed.

Thus, the suspension board with circuit 1 in the process of production (the suspension board with circuit 1 before the semiconductive layer 10 is formed) which includes the insulating base layer 3, the insulating cover layer 5, and the conductive pattern 4 is prepared.

In the suspension board with circuit 1 in the process of production, the conductive pattern 4 integrally includes the wires 6 covered with the insulating cover layer 5 and the terminal portions 7 exposed from the insulating cover layer 5 and formed with the plating layer 8 on the surface thereof. The longitudinal middle portions of the wires 6 are adapted to form the exposed portions 11 exposed from the openings 12 inside the protruding portions 26.

Next, as shown in FIG. 4(f), the protective layers 9 are formed on the exposed portions 11. The protective layers 9 are laminated to be in contact with the exposed portions 11 and provided to be exposed from the openings 12.

To form the protective layers 9, e.g., plating using a plating solution of any of the materials mentioned above, printing using a metal paste containing particles of any of the materials mentioned above, coating using a solder containing any of the materials mentioned above, or the like is used.

In plating, e.g., electrolytic plating or electroless plating is used. Preferably, electrolytic plating or electroless plating using a plating solution of lead and/or tin is used.

In printing using a metal paste, e.g., a paste containing particles of any of the materials mentioned above, or preferably a paste containing particles of lead and/or tin is printed in the exposed portions 11 and then sintered.

In coating using a solder, a solder made of any of the materials mentioned above, or preferably a solder of lead and/or tin is coated in the exposed portions 11 and then heated.

Next, as shown in FIG. 4(*g*), the semiconductive layer 10 is formed on the surface of the insulating cover layer 5 and on the surface of the insulating base layer 3.

To form the semiconductive layer 10, the suspension board with circuit in the process of production shown in FIG. 4(*f*) is dipped in a polymerization solution of a conductive polymer, while a polymerization initiator is mixed in the polymerization solution.

The polymerization solution of the conductive polymer is prepared by, e.g., mixing a monomer to be polymerized to produce the conductive polymer with a solvent.

As the monomer, there can be used, e.g., aniline, pyrrole, thiophene, or the like. Preferably, aniline is used. These monomers can be used alone or in a combination of two or more kinds.

As the solvent, there can be used, e.g., water, an acidic aqueous solution, or the like. Preferably an acidic aqueous solution is used. As an acidic component forming an acidic aqueous solution, there can be used, e.g., an inorganic acid such as, e.g., a hydrochloric acid, a nitric acid, a sulfuric acid, or a phosphoric acid or an organic acid such as, e.g., a formic acid, an acetic acid, or an oxalic acid.

As the polymerization initiator, there can be used, e.g., an azo initiator such as, e.g., 2,2'-azobisisobutyronitrile, 2,2'-azobis(2-methylpropionamidine) disulfate, or 2,2'-azobis(2-methylpropionamidine) dihydrochloride, a persulfate initiator such as, e.g., potassium persulfate (potassium peroxodisulfate) or ammonium persulfate (ammonium peroxodisulfate), a peroxide initiator such as, e.g., benzoyl peroxide, t-butylhydroperoxide, or hydrogen peroxide, a substituted-ethane initiator such as, e.g., phenyl-substituted ethane, a carbonyl initiator such as, e.g., an aromatic carbonyl compound, or a redox initiator such as, e.g., a persulfate/sodium hydrogen sulfite combination or a peroxide/sodium ascorbate combination. These polymerization initiators can be used alone or in a combination of two or more kinds.

To mix the polymerization initiator in the polymerization solution, it is also possible to prepare a polymerization initiator solution by dissolving the polymerization initiator in a solvent and then mix the polymerization initiator solution in the polymerization solution, as necessary. As the solvent used to prepare the polymerization initiator solution, the same solvent as used to prepare the polymerization solution is used.

In the polymerization solution of the conductive polymer, the concentration of the monomer is in the range of, e.g., 0.005 to 0.5 mol/L, or preferably 0.01 to 0.1 mol/L. The concentration of the acidic component when the solvent is the acidic aqueous solution is in the range of, e.g., 0.002 to 0.1 mol/L, or preferably 0.005 to 0.05 mol/L. In the polymerization solution when the polymerization initiator (or the polymerization initiator solution) is mixed therein, the concentration of the polymerization initiator is in the range of, e.g., 0.002 to 0.2 mol/L, or preferably 0.005 to 0.1 mol/L.

After the suspension board with circuit 1 described above is dipped in the polymerization solution of the conductive polymer and the polymerization initiator is mixed in the polymerization solution, the suspension board with circuit 1 is dipped in the polymerization solution of the conductive polymer for, e.g., 5 to 180 minutes, or preferably 10 to 100 minutes.

In the dipping mentioned above, the dipping temperature of the polymerization solution of the conductive polymer is set to the range of, e.g., 1 to 40° C., or preferably 5 to 25° C.

As a result, the semiconductive layer 10 made of the conductive polymer is formed by polymerization to be deposited on the surfaces of the insulating layers, i.e., on the surface of the insulating cover layer 5 and on the surface of the insulating base layer 3.

Thereafter, the suspension board with circuit 1 in the process of production on which the semiconductive layer 10 is formed is washed with water.

Then, in the method, the conductive polymer of the semiconductive layer 10 is doped as necessary.

To dope the conductive polymer of the semiconductive layer 10, the suspension board with circuit 1 on which the semiconductive layer 10 mentioned above is formed is dipped in a solution in which a dopant is dissolved (dopant solution).

The dopant imparts a conductivity to the conductive polymer. As the dopant, there can be used, e.g., a p-toluenesulfonic acid, a dodecylbenzenesulfonic acid, an alkylnaphthalenesulfonic acid, a polystyrenesulfonic acid, a p-toluenesulfonic acid novolac resin, a p-phenolsulfonic acid novolac resin, a β-naphthalenesulfonic acid formalin condensate, or the like. These dopants can be used alone or in a combination of two or more kinds.

As the solvent for dissolving the dopant, there can be used, e.g., water, methanol, or the like.

In the preparation of the dopant solution, the solvent is mixed such that the concentration of the dopant is in the range of, e.g., 5 to 100 wt %, or preferably 10 to 50 wt %.

The dipping time during which the suspension board with circuit 1 on which the semiconductive layer 10 is formed is dipped in the dopant solution is set to the range of, e.g., 30 seconds to 30 minutes, or preferably 1 to 10 minutes.

The dipping (doping) temperature of the dopant solution is set to the range of, e.g., 10 to 70° C., or preferably 20 to 60° C.

By doping the conductive polymer of the semiconductive layer 10 mentioned above, a conductivity is imparted to the conductive polymer.

The surface resistance value of the semiconductive layer 10 doped with the conductive polymer is in the range of, e.g., $1 \times 10^5$ to $1 \times 10^{12} \Omega/\square$, or preferably $1 \times 10^6$ to $1 \times 10^{11}$ $\Omega/\square$. The surface resistance value of the semiconductive layer 10 can be measured using, e.g., Hiresta IP MCP-HT260 (Measurement Probe: HRS) available from Mitsubishi Petrochemical Co., Ltd.

Thereafter, in the method, the suspension board with circuit 1 in the process of production on which the semiconductive layer 10 doped with the conductive polymer is formed is further washed with water.

In the producing method of the suspension board with circuit 1, the protective layers 9 are provided on the exposed portions 11 exposed from the openings 12. As a result, when the suspension board with circuit 1 provided with the protective layers 9 is dipped in the polymerization solution of the conductive polymer, the protective layers 9 are in contact with the conductive pattern 4 at the exposed portions 11. In addition, because the standard electrode potential of the material forming the protective layers 9 is lower than that of the conductive material forming the conductive pattern 4, local cells are formed in the protective layers 9 and the conductive pattern 4. Therefore, due to the principle of such local cells, the material forming the protective layers 9 having the standard electrode potential lower than that of the conductive material forming the conductive pattern 4 (i.e., having a higher ionization tendency) is dissolved, while the conductive material forming the conductive pattern 4 is less likely to be dissolved, even though the conductive material is exposed at the terminal portions 7.

As a result, it is possible to prevent corrosion of the terminal portions 7, and also form the semiconductive layer 10 on the surface of the insulating cover layer 5 and on the surface of the insulating base layer 3.

This allows the prevention of discoloration of the terminal portions 7, and also allows efficient removal of static electricity from the obtained suspension board with circuit 1.

In the producing method of the suspension board with circuit 1, the plating layer 8 is formed on the surfaces of the terminal portions 7 to protect the terminal portions 7. However, when the suspension board with circuit 1 is dipped in the polymerization solution of the conductive polymer, there is the possibility that the polymerization solution of the conductive polymer may penetrate through the interface between the peripheral end of the plating layer 8 and the insulating cover layer 5 and the insulating base layer 3 to corrode the terminal portions 7. In this method, however, the conductive material of the terminal portions 7 is less likely to be dissolved due to the principle of the local cells described above, so that which result in less concern of such corrosion. This allows effective prevention of discoloration of the terminal portions 7.

In addition, in the method, the exposed portions 11 exposed from the openings 12 of the insulating cover layer 5 is formed in the conductive pattern 4. Therefore, by providing the protective layers 9 on the exposed portions 11, the protective layers 9 can be easily laminated.

Moreover, since the protective layers 9 are laminated, the protective layers 9 can be reliably brought into contact with the conductive pattern 4. This allows reliable prevention of corrosion of the terminal portions 7, and consequently allows reliable prevention of discoloration of the terminal portions 7.

In the suspension board with circuit 1 in the process of production, when the conductive material of the conductive pattern 4 is copper and the material of the protective layer 9 is lead and/or tin, the dissolution of copper from the terminal portions 7 is reliably suppressed because lead and/or tin are lower in standard electrode potential than copper.

This allows reliable prevention of corrosion of the terminal portions 7, and consequently allows reliable prevention of discoloration of the terminal portions 7.

In the producing method of the suspension board with circuit 1, when the conductive polymer is polyaniline, the obtained suspension board with circuit 1 allows more efficient removal of static electricity from the obtained suspension board with circuit 1.

Next, a producing method of a suspension board with circuit as another embodiment of the producing method of the wired circuit board according to the present invention will be described with reference to FIGS. 5 and 8. In each of FIGS. 5 to 8, members corresponding to the respective members described above are designated by the same reference numerals, so that a detailed description thereof is omitted.

In the description of the producing method of the suspension board with circuit 1 given above, the protective layers 9 are laminated on the exposed portions 11. However, instead of laminating the protective layers 9, it is also possible to, e.g., pinch the suspension board with circuit 1 with a clip 19 as a contact member, while the suspension board with circuit 1 is dipped in the polymerization solution of the conductive polymer.

Figure 5:
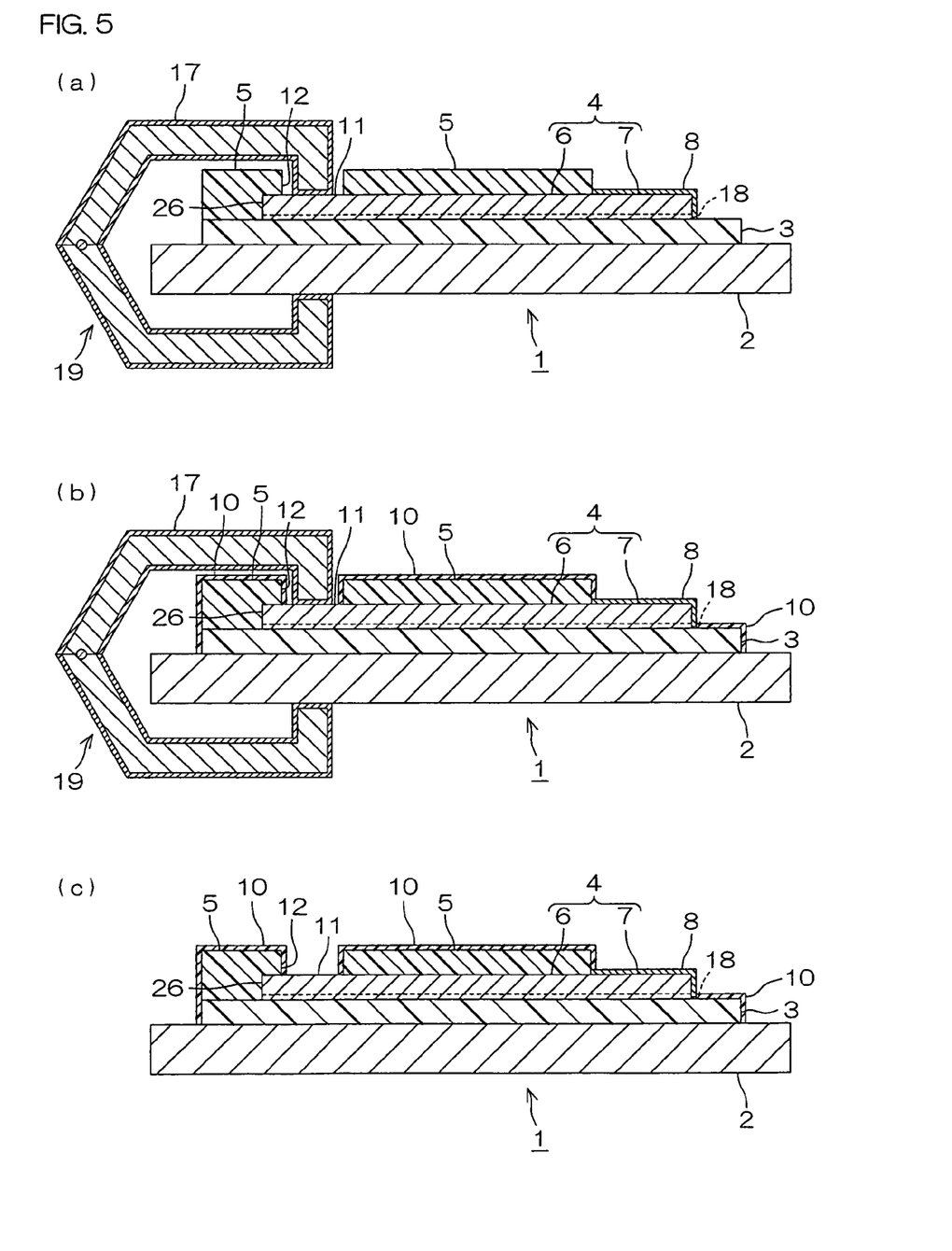
FIG. 5 is a cross-sectional view showing the process steps of producing a suspension board with circuit as another embodiment of the producing method of the wired circuit board according to the present invention, (a) showing the step of pinching an exposed portion with a clip covered with a cover layer, (b) showing the step of forming a semiconductive layer on the surface of the insulating base layer and on the surface of the insulating cover layer, and (c) showing the step of removing the clip from the exposed portion.

That is, as shown in FIG. 5(a), the suspension board with circuit 1 is pinched by the clip 19 such that the clip 19 is in contact with the exposed portions 11 and the metal supporting board 2 opposing the exposed portions 11.

The clip 19 is formed of a metal material such as, e.g., stainless steel such that the entire surfaces thereof is covered with cover layers 17 made by plating or the like.

The cover layers 17 are made of a material having a standard electrode potential lower than that of the conductive material forming the conductive pattern 4. For example, the cover layers 17 are made of the same material as forming the protective layers 9 mentioned above, or preferably nickel.

Next, as shown in FIG. 5(b), the suspension board with circuit 1 pinched by the clips 19 is dipped as it is in the polymerization solution of the conductive polymer, so that the semiconductive layer 10 is formed on the surface of the insulating base layer 3 and on the surface of the insulating cover layer 5.

Thereafter, as shown in FIG. 5(c), the clip 19 is removed from the suspension board with circuit 1.

In accordance with the method, the suspension board with circuit 1 is pinched by the clip 19 covered with the cover layer 17. As a result, when the suspension board with circuit 1 pinched by the clip 19 is dipped in the polymerization solution of the conductive polymer, local cells are formed in the cover layer 17 and the conductive pattern 4, in the same manner as described above. Therefore, the material forming the cover layer 17 having a standard electrode potential lower than that of the conductive material forming the conductive pattern 4 (i.e., having a higher ionization tendency) is dissolved, while the conductive material forming the conductive pattern 4 is less likely to be dissolved, even though the conductive material is exposed at the terminal portions 7.

As a result, it is possible to prevent corrosion of the terminal portions 7, and also form the semiconductive layer 10 on the surface of the insulating cover layer 5 and on the surface of the insulating base layer 3.

This allows the prevention of discoloration of the terminal portions 7, and also allows efficient removal of static electricity from the obtained suspension board with circuit 1.

In the method, moreover, the suspension board with circuit 1 is detachably pinched by the clip 19 and then dipped in the polymerization solution of the conductive polymer, so that the semiconductive layer 10 is formed. Thereafter, the clip 19 is removed from the suspension board with circuit 1 without remaining on the suspension board with circuit 1, unlike the protective layers 9 described above. As a result, it is possible to improve the reliability of the suspension board with circuit 1.

In the description given above, the protective layers 9 are provided inside the suspension board with circuit 1. However, as shown in, e.g., FIG. 6, the protective layers 9 may also be provided outside the suspension board with circuit 1.

Figure 6:
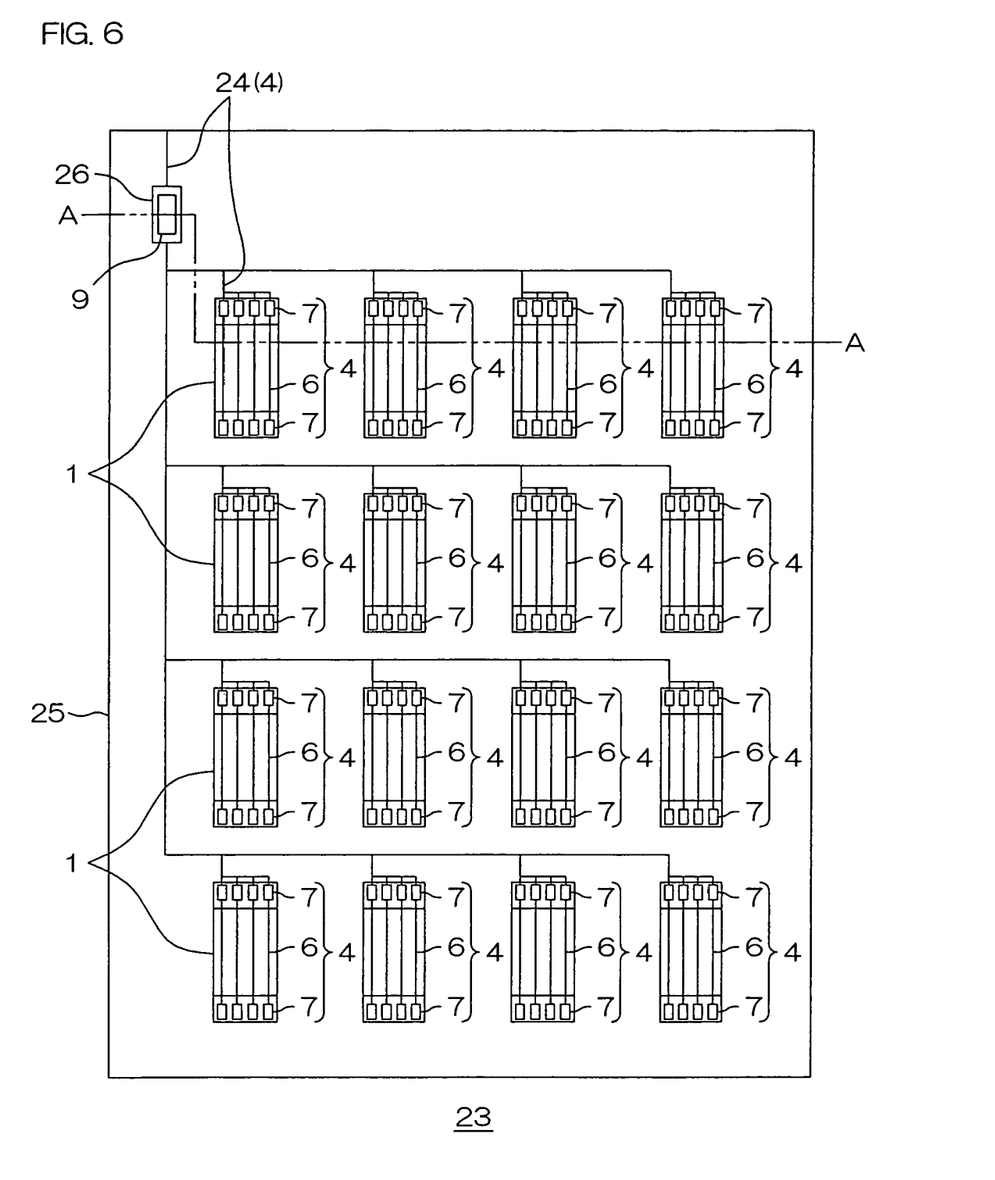
FIG. 6 is a plan view of a suspension-board-with-circuit sheet including a plurality of suspension boards with circuit as an embodiment of the wired circuit board produced by the producing method of the wired circuit board according to the present invention.

That is, in FIG. 6, the suspension board with circuit 1 is produced in the method as a suspension-board-with-circuit sheet 23 including a plurality of the suspension boards with circuit 1.

In the method, the suspension-board-with-circuit sheet 23 includes the plurality of suspension boards with circuit 1 and a support frame 25 for separably supporting the plurality of suspension boards with circuit 1.

The individual suspension boards with circuit 1 are aligned in mutually spaced-apart relation within the support frame 25 and supported by the support frame 25 via a plurality of cuttable joint portions not shown.

In each of the plurality of suspension boards with circuit 1 (inside each of the suspension boards with circuit 1), the conductive pattern 4 includes the wires 6 and the terminal portions 7. In the support frame 25 (outside the suspension boards with circuit 1), the conductive pattern 4 includes a plating lead 24.

Figure 8:
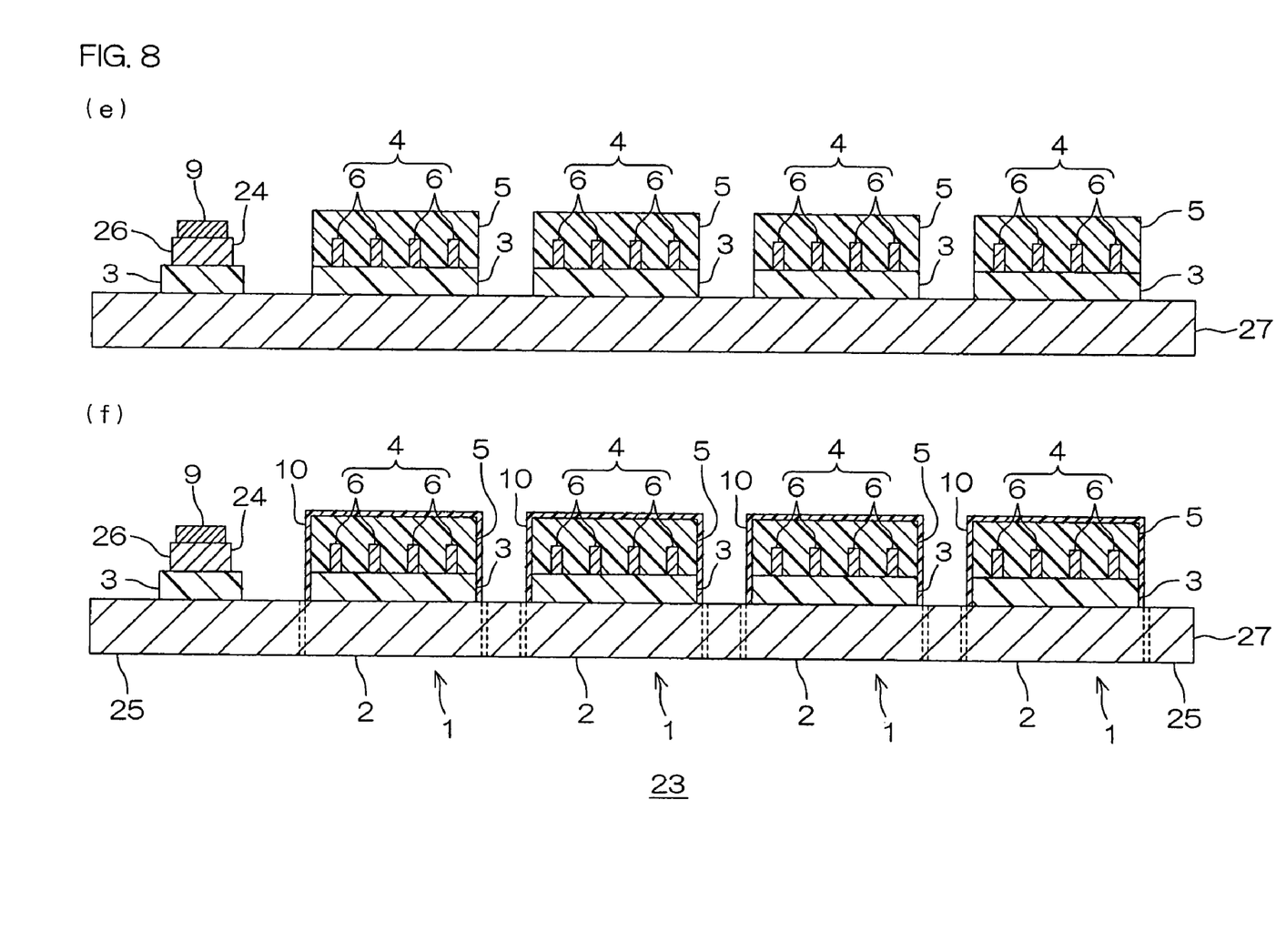
FIG. 8 is a cross-sectional view along the line A-A showing the process steps of producing the suspension-board-with-circuit sheet shown in FIG. 6, subsequently to FIG. 7, (e) showing the step of forming a protective layer in a protruding portion of a plating lead, and (f) showing the step of forming a semiconductive layer on the surface of the insulating cover layer and on the surface of the insulating base layer.

As shown in FIG. 8(*f*), the support frame 25 is the portion of a metal supporting layer 27, described later, except for the respective metal supporting boards 2 of the suspension boards with circuit 1. The support frame 25 is formed in the shape of a generally rectangular sheet when viewed in plan view. On the support frame 25, the insulating base layer 3 and the plating lead 24 formed on the insulating base layer 3 are provided.

The insulating base layer 3 is formed in a pattern corresponding to the position where the plating lead 24, described later, is formed in the support frame 25.

The plating lead 24 is formed to electrically connect a plating lead terminal, not shown, to the wires 6 and the terminal portions 7 and form the plating layer 8 by electrolytic plating. More specifically, as shown in FIG. 6, the single plating lead 24 is branched to be connected to each of the suspension boards with circuit 1. In each of the suspension boards with circuit 1, the branched plating leads 24 are further branched to be connected to the individual wires 6 and terminal portions 7. The plating lead 24 is provided as the exposed portion 11 which is entirely exposed from the insulating cover layer 5. One protruding portion 26 is formed in the middle of the branched plating lead 24.

Next, a description will be given to a producing method of the suspension-board-with-circuit sheet 23 with reference to FIGS. 7 and 8.

Figure 7:
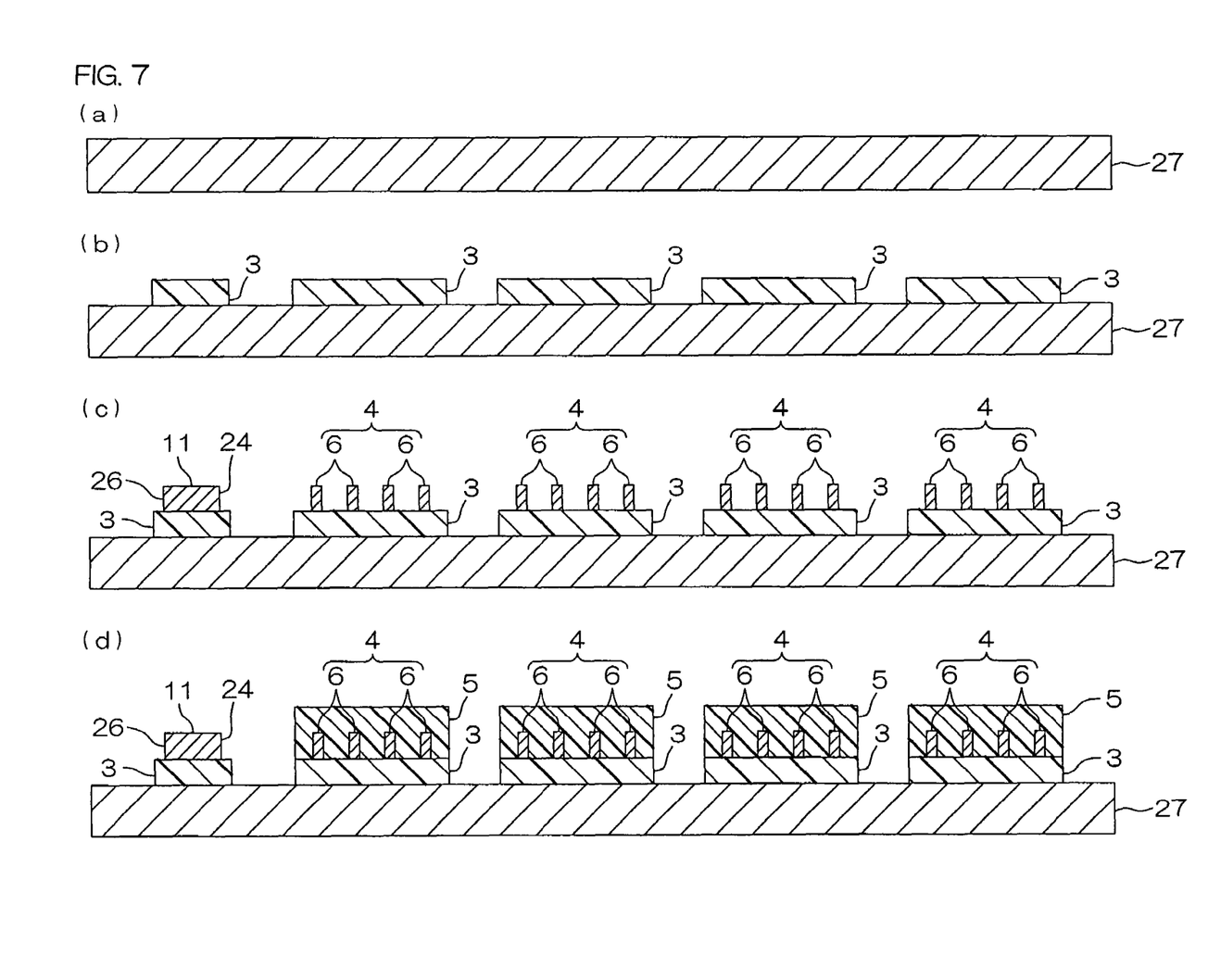
FIG. 7 is a cross-sectional view along the line A-A showing the process steps of producing the suspension-board-with-circuit sheet shown in FIG. 6, (a) showing the step of preparing a metal supporting board, (b) showing the step of forming an insulating base layer on the metal supporting board, (c) showing the step of forming a conductive pattern, and (d) showing the step of forming an insulating cover layer on the insulating base layer.

First, as shown in FIG. 7(*a*), the metal supporting layer 27 is prepared in the method. To form the metal supporting layer 27, the same metal material as used to form the metal supporting board 2 is used.

Next, as shown in FIG. 7(*b*), the insulating base layer 3 is formed in a pattern corresponding to the individual suspension boards with circuit 1 and to the plating lead 24 on the metal supporting layer 27. To form the insulating base layer 3, the same method as described above is used.

Next, as shown in FIG. 7(*c*), the conductive pattern 4 is formed in a wired circuit pattern corresponding to the individual suspension boards with circuit 1 on the insulating base layer 3, while the plating lead 24 is formed on the insulating base layer 3 in the support frame 25 (see FIG. 8(*f*)). The plating lead 24 is formed of the same conductive material as forming the conductive pattern 4. To form the conductive pattern 4 and the plating lead 24, the same method as described above is used.

Next, as shown in FIG. 7(*d*), the insulating cover layer 5 is formed in a pattern corresponding to the individual suspension boards with circuit 1 on the insulating base layer 3 to cover the wires 6 of the conductive pattern 4 and expose the terminal portions 7 of the conductive pattern 4. To form the insulating cover layer 5, the same method as described above is used.

Thereafter, in the method, the plating layer 8 is formed on the surface of the terminal portions 7, though not shown. To form the plating layer 8, the same method as described above is used.

Next, as shown in FIG. 8(*e*), the protective layer 9 is formed in the protruding portion 26 of the branched plating lead 24. To form the protective layer 9, the same method as described above is used.

Next, as shown in FIG. 8(*f*), the semiconductive layer 10 is formed on the surface of the insulating cover layer 5 and on the surface of the insulating base layer 3. To form the semiconductive layer 10, the same method as described above is used.

Then, in the method, the metal supporting layer 27 is trimmed to form joint portions, not shown, so that the metal supporting boards 2 corresponding to the respective suspension boards with circuit 1 are formed. Thereafter, by cutting the joint portion not shown, the suspension boards with circuit 1 are each cut away from the support frame 25 along the dotted lines. As a result, the plating lead 24 and the wires 6 and terminal portions 7 of each of the suspension boards with circuit 1 are electrically disconnected.

Thus, in the method, each of the suspension boards with circuit 1 is separated from the support frame 25 on which the protective layer 9 is formed so that the protective layer 9 does not remain on each of the suspension boards with circuit 1. Accordingly, it is possible to improve the reliability of the suspension board with circuit 1.

In addition, because the single protective layer 9 is provided on the single suspension-board-with-circuit sheet 23, the protective layer 9 can be easily provided and the process steps of producing the suspension board with circuit 1 can be simplified.

In the description given above, the suspension board with circuit 1 is used as an example of the wired circuit board according to the present invention. However, the wired circuit board according to the present invention is not limited thereto. The wired circuit board according to the present invention is widely applicable to a single-sided flexible wired circuit board, a double-sided flexible wired circuit board, or a multilayer flexible wired circuit board, or further to other wired circuit boards such as various flexible wired circuit boards in which the metal supporting board 2 is provided as a reinforcing layer.

EXAMPLES

The present invention is described more specifically by showing examples and a comparative example herein below. However, the present invention is by no means limited to the examples and the comparative example.

(Production of Suspension Board with Circuit)

Example 1

A metal supporting board made of stainless steel having a thickness of 20 μm was prepared (see FIG. 3(*a*)).

Then, a varnish of a photosensitive polyamic acid resin was uniformly coated on the upper surface of the metal supporting board using a spin coater. Then, the coated varnish was heated at 90° C. for 15 minutes to form a base coating. Thereafter, the base coating was exposed to light at 700 mJ/cm$^2$ via a photomask, heated at 190° C. for 10 minutes, and then developed using an alkaline developer. Subsequently, the base coating was cured at 385° C. under a reduced pressure of 1.33 Pa to form an insulating base layer made of polyimide in the foregoing pattern having a rectangular shape when viewed in plan view on the metal supporting board (see FIG. 3(*b*)). The thickness of the insulating base layer was 10 μm.

Then, a conductive pattern made of copper and having a thickness of 15 μm was formed in the foregoing pattern by an additive method (see FIG. 3(*c*)). The spacing between individual wires was 1000 μm. The width of each of the wires was 30 μm. The length of each of terminal portions was 200 μm and the width thereof was 200 μm. The width of each of protruding portions was 500 μm and the length thereof was 500 μm.

Then, the varnish of the photosensitive polyamic acid resin mentioned above was uniformly coated on the upper surface of the metal supporting board including the conductive pattern and the insulating base layer using a spin coater and heated at 90° C. for 10 minutes to form a cover coating having a thickness of 15 μm. Thereafter, the cover coating was exposed to light at 700 mJ/cm$^2$ via a photomask, heated at 180° C. for 10 minutes, and then developed using an alkaline developer to be patterned. Subsequently, the cover coating was cured at 385° C. under a reduced pressure of 1.33 Pa to form an insulating cover layer made of polyimide in a pattern having a rectangular shape when viewed in plan view on the insulating base layer such that the wires are covered, the terminal portions are exposed, and openings exposing exposed portions are formed (see FIG. 3(d)). The thickness of the insulating cover layer was 4 μm. The length of each of the openings was 200 μm and the width thereof was 200 μm.

Then, a plating resist was formed on the metal supporting board and on the exposed portions. Subsequently, electroless gold plating was performed to form a gold plating layer on the surface of the terminal portions. Thereafter, the plating resist was removed (see FIG. 4(e)). The thickness of the gold plating layer was 2.5 μm.

Then, an eutectic solder of lead and tin (having a standard electrode potential of −0.13 V at 25° C.) was coated on the exposed portions and heated to laminate protective layers (see FIG. 4(f)). The thickness of the protective layers was 150 μm.

Then, a semiconductive layer was formed on the surface of the insulating cover layer and on the surface of the insulating base layer (see FIG. 4(g)).

In the formation of the semiconductive layer, about 300 g of pure water and 2.5 g of aniline were successively added first to 2.0 g of a 98% concentrated sulfuric acid and cooled under stirring until the temperature reached 10° C. to prepare a polymerization solution of polyaniline. Then, 20 g of pure water was added to 10.7 g of ammonium peroxodisulfate (ammonium persulfate: APS) and stirred till the ammonium peroxodisulfate was dissolved and cooled until the temperature reached 10° C. separately to prepare an aqueous polymerization initiator solution.

Subsequently, the suspension board with circuit on which the protective layer was laminated was dipped in the polymerization solution of polyaniline mentioned above, while the aqueous polymerization initiator solution was added to the polymerization solution and mixed therewith. Thereafter, the suspension board with circuit was further dipped at 10° C. for 12 minutes to polymerize aniline and deposit polyaniline on the surface of the insulating base layer and on the surface of the insulating cover layer.

In the polymerization solution to which the polymerization initiator was added, the concentration of aniline was 0.05 mol/L, the concentration of the sulfuric acid was 0.04 mol/L, and the concentration of ammonium peroxodisulfate was 0.09 mol/L.

Thereafter, the suspension board with circuit in the process of production was withdrawn from the polymerization solution, washed with water, and dipped in an aqueous dopant solution of a p-phenolsulfonic acid novolac resin (PPSA) at a concentration of 20% by weight at 60° C. for 10 minutes, so that the polyaniline in the semiconductive layer was doped. Then, the suspension board with circuit was washed with water. The thickness of the semiconductive layer made of the doped polyaniline was 0.03 μm. The surface resistance value of the semiconductive layer made of the doped polyaniline was $1 \times 10^7$ to $1 \times 10^8 \Omega/\square$.

Example 2

A suspension board with circuit was obtained by performing the same process as in EXAMPLE 1 except that the suspension board with circuit was pinched by a stainless steel clip, instead of coating an eutectic solder of lead and tin and heating.

That is, the suspension board with circuit was pinched by the stainless steel clip such that the stainless steel clip was in contact with the exposed portions and the metal supporting board opposing the exposed portions (see FIG. 5(a)). The entire surface of the stainless steel clip is covered with a cover layer formed by nickel plating.

Then, the suspension board with circuit pinched by the stainless steel clip was dipped as it was in the polymerization solution of polyaniline, while the aqueous polymerization initiator solution was added thereto, so that the semiconductive layer was formed (see FIG. 5(b)).

Thereafter, the stainless steel clip was removed from the suspension board with circuit (see FIG. 5(c)).

Comparative Example 1

A suspension board with circuit was obtained by performing the same process as in EXAMPLE 1 except that the protective layer laminated in EXAMPLE 1 was not laminated.

(Evaluation)

The terminals portions of the suspension boards with circuit obtained by EXAMPLES 1 and 2 and COMPARATIVE EXAMPLE 1 were visually observed.

In the suspension boards with circuit of EXAMPLES 1 and 2, discoloration of the terminal portions was not recognized.

However, in the suspension board with circuit of COMPARATIVE EXAMPLE 1, discoloration of the terminal portions was recognized.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A method of producing a wired circuit board, the method comprising the steps of:
   preparing a wired circuit board comprising an insulating base layer, a conductive pattern formed on the insulating base layer, and insulating cover layer on the insulating base layer so as to cover the conductive pattern, wherein an opening is formed in the insulating cover layer, and the conductive pattern comprises an portion exposed from the opening of the insulating cover layer, a wire covered with the insulating cover layer, and a terminal portion exposed from an end portion in the insulting cover layer different from a position in which the opening of the insulating cover is located;
   disposing a contact member formed of a material having a standard electrode potential lower than that of a conductive material forming the conductive pattern such that the contact member is in contact with the conductive pattern, in the exposed portion; and
   dipping the wired circuit board including the disposed contact member in a polymerization solution of a conductive polymer to form a semiconductive layer on a surface of the insulating base layer and the insulating cover layer such that the material forming the contact member is dissolved, while the conductive material forming the conductive pattern is less likely to be dissolved due to a principle of a local cell formed in the contact member and the conductive pattern.

2. The method of producing the wired circuit board according to claim 1, wherein the step of preparing the wired circuit board includes:

forming a plating layer on a surface of the terminal portion.

3. The method of producing the wired circuit board according to claim 1, wherein the contact member is a protective layer laminated on the exposed portion.

4. The method of producing the wired circuit board according to claim 1, wherein the step of disposing the contact member includes:

disposing the contact member removably on the exposed portion; and dipping the wired circuit board disposed with the contact member in the polymerization solution of the conductive polymer and then removing the contact member from the exposed portion.

5. The method of producing the wired circuit board according to claim 1, wherein the conductive material of the conductive pattern is copper, and the material of the contact member is lead and/or tin.

6. The method of producing the wired circuit board according to claim 1, wherein the semiconductive polymer is polyaniline.

* * * * *

UNITED STATES PATENT AND TRADEMARK OFFICE
CERTIFICATE OF CORRECTION

PATENT NO. : 7,694,416 B2 Page 1 of 1
APPLICATION NO. : 11/987976
DATED : April 13, 2010
INVENTOR(S) : Jun Ishii, Yasunari Ooyabu and Hiroyuki Kurai It is certified that error appears in the above-identified patent and that said Letters Patent is hereby corrected as shown below:

- Column 16, line 55, the word "exposed" is omitted, and the line should read --the conductive pattern comprises an exposed portion exposed--.

Signed and Sealed this

Sixth Day of July, 2010

David J. Kappos
*Director of the United States Patent and Trademark Office*